United States Patent [19]

Baliga et al.

[11] Patent Number: 4,942,440
[45] Date of Patent: Jul. 17, 1990

[54] HIGH VOLTAGE SEMICONDUCTOR DEVICES WITH REDUCED ON-RESISTANCE

[75] Inventors: Bantval J. Baliga; Eric J. Wildi, both of Clifton Park, N.Y.

[73] Assignee: General Electric Company, Schenectady, N.Y.

[21] Appl. No.: 243,210

[22] Filed: Sep. 9, 1988

Related U.S. Application Data

[63] Continuation of Ser. No. 47,524, May 4, 1987, abandoned, which is a continuation of Ser. No. 774,195, Sep. 9, 1985, abandoned, which is a continuation of Ser. No. 436,244, Oct. 25, 1982, abandoned.

[51] Int. Cl.⁵ .............................. H01L 29/78
[52] U.S. Cl. ..................... 357/23.1; 357/22; 357/41; 357/43; 357/53; 307/631; 307/633; 307/571
[58] Field of Search ............ 357/23.1, 22, 35, 38, 357/43, 41, 51, 52, 53, 48; 307/431, 633, 571

[56] References Cited

U.S. PATENT DOCUMENTS

| | | | |
|---|---|---|---|
| 4,086,611 | 4/1978 | Nishizawa et al. | 357/38 |
| 4,292,642 | 9/1981 | Appels et al. | 357/22.5 |
| 4,354,121 | 10/1982 | Terasawa et al. | 307/633 |
| 4,409,606 | 10/1983 | Wagenaar et al. | 357/22 G |
| 4,422,089 | 12/1983 | Vaes et al. | 357/35 |
| 4,485,392 | 11/1984 | Singer | 357/22 F |
| 4,494,134 | 1/1985 | Wildi et al. | 357/43 |

FOREIGN PATENT DOCUMENTS

| | | | |
|---|---|---|---|
| 53-63987 | 6/1978 | Japan | 357/22 G |
| 53-67368 | 6/1978 | Japan | 357/22 |
| 56-62372 | 5/1981 | Japan | 357/22 G |

OTHER PUBLICATIONS

M. Cowan et al., "Combat Lat. PNP..., Device", IBM Tech. Discl. Bull., vol. 13 #4, Sep. 1970, pp. 939–940.
R. Hruby et al., "Substrate-Emitter... Appl.", IEEE J. S-S Ckts., vol. SC-6 #3, Jun. 1971, pp. 115–119.

Primary Examiner—Joseph E. Clawson, Jr.
Attorney, Agent, or Firm—Robert Ochis; James C. Davis, Jr.; Marvin Snyder

[57] ABSTRACT

A high voltage P-N diode includes a P⁻ substrate with a thin N⁻ epitaxial layer thereon. An N⁺ cathode region extends into the N⁻ epitaxial layer from the upper surface thereof. A P⁺ anode region extends into the N⁻ epitaxial layer from its upper surface and surrounds the N⁺ cathode region. An N⁺ buried layer is situated between the P⁻ substrate and the N⁻ epitaxial layer, beneath the P⁺ anode region, and surrounds the N⁺ cathode region, as viewed from above. A further P⁺ region extends into the N⁻ epitaxial layer from its upper surface and surrounds the N⁺ cathode region, and, in turn, is surrounded by the P⁺ anode region. In an exemplary embodiment, a MOSFET is included to alternately connect the further P⁺ region to the P⁻ substrate and to open circuit the further P⁺ region. With the further P⁺ region open circuited, the P-N diode has a low on-resistance when it operates in its current-conducting state. An embodiment structurally similar to the P-N diode comprises a bipolar transistor having an N⁺ emitter region extending into a P⁺ base region, which corresponds to the P⁺ anode region of the diode.

36 Claims, 1 Drawing Sheet

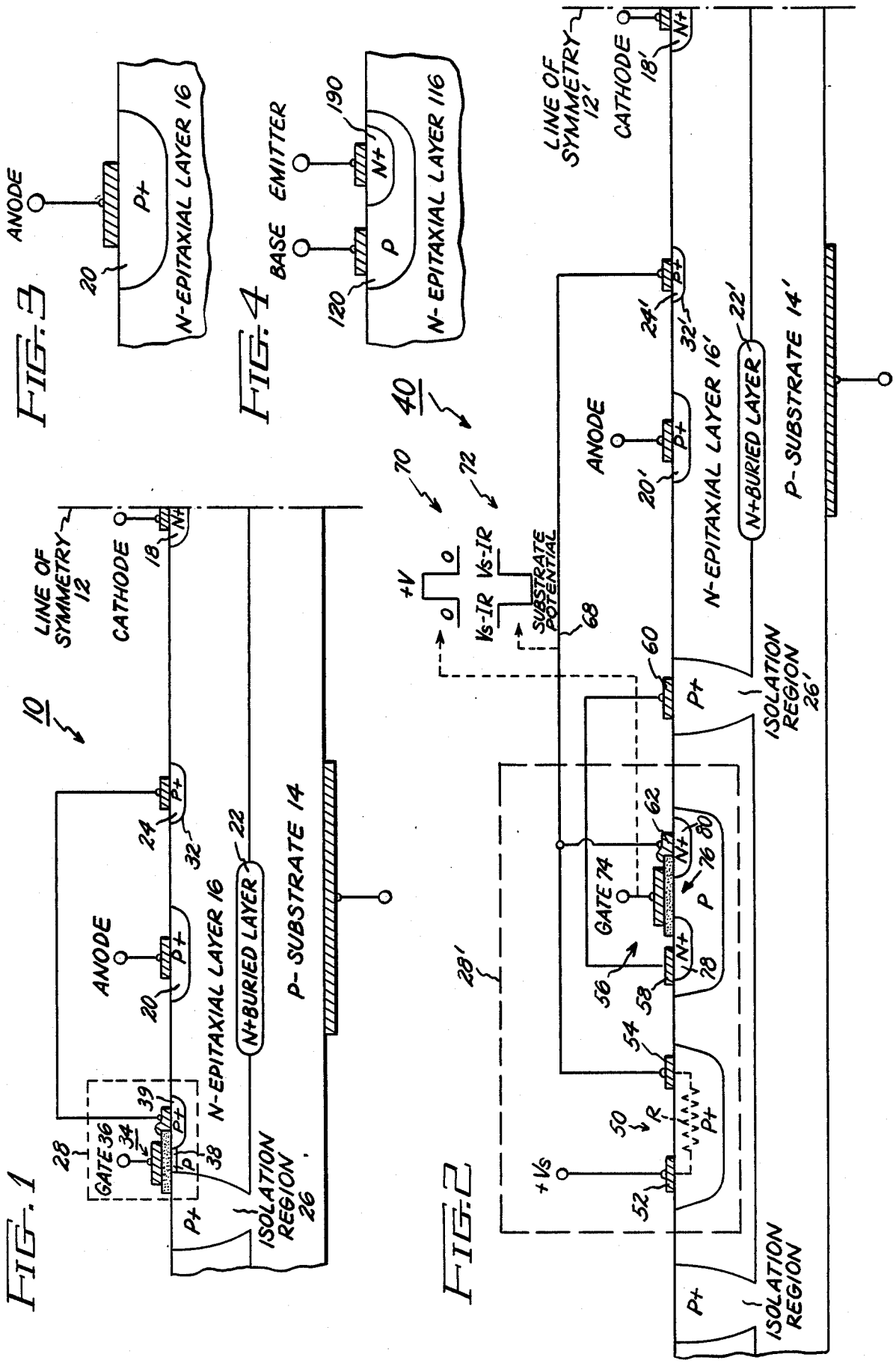

HIGH VOLTAGE SEMICONDUCTOR DEVICES WITH REDUCED ON-RESISTANCE

CROSS-REFERENCE TO RELATED APPLICATION

This application is a continuation of application Ser. No. 047,524 filed May 4, 1987, now abandoned, as a continuation of application Ser. No. 774,195 filed Sept. 9, 1985, now abandoned as a continuation of application Ser. No. 436,244, filed Oct. 25, 1982, now abandoned.

The present application is related to commonly-assigned U.S. Pat. No. 394,346, filed July 1, 1982, by M. S. Adler and E. J. Wildi (one of the present inventors), the entirety of which is hereby incorporated by reference.

BACKGROUND OF THE INVENTION

Our invention relates to semiconductor devices capable of supporting high reverse voltages while in a current-blocking state and, more particularly, to such devices having means for reducing the on-resistance (or anode-to-cathode resistance while "on" or conducting) of the devices.

The above-referenced application describes a high voltage P-N diode including a thin N⁻ (or lightly-doped N-type) layer atop a P⁻ substrate. An N⁺ (or highly-doped N-type) cathode region extends into the N⁻ epitaxial layer from its upper surface, and a P⁺ anode region extends into the N⁻ epitaxial layer from its upper surface and surrounds the N⁺ cathode region. To reduce parasitic currents in the device, an N⁺ buried layer exists between the P⁻ substrate and the N⁻ epitaxial layer, beneath the P⁺ anode region, so as to surround the N⁺ cathode region (when viewed from above). In order to avoid the loss of voltage-supporting capability in the N⁻ epitaxial layer between the N⁺ cathode region and the N⁺ buried layer, a further P⁺ region extends into the N⁻ epitaxial layer from its upper surface and is interposed between the N⁺ cathode region and the P⁺ anode region so as to surround the N⁺ cathode region and, in turn, be surrounded by the P⁺ anode region. The further P⁺ region is permanently biased at or near the potential the P⁻ substrate, whereby the N⁻ epitaxial layer, between the further P⁺ region and the N⁺ cathode region, supports reverse voltages in the device. The foregoing P-N diode attains a reasonably low value of on-resistance. It would be desirable, however, to provide a diode having an even lower value of on-resistance.

The above-referenced patent application describes (and claims) a bipolar transistor which is structurally similar to the foregoing P-N diode. The present invention addresses a similar concern about the desirability of reduced on-resistance of a bipolar transistor.

SUMMARY OF THE INVENTION

Accordingly, it is an object of our invention to provide a high voltage semiconductor device having a lower value of on-resistance than previously attainable.

A further object of our invention is to provide electronic circuitry for enabling a high voltage semiconductor device to achieve a lower value of on-resistance than previously attainable, which circuitry can be formed in a single integrated circuit along with the high voltage semiconductor device.

In accordance with the illustrated embodiments of our invention, we provide a P-N diode of the type including a P⁻ substrate with an N⁻ layer thereon, and further including an N⁺ cathode region, a P⁺ anode region, an N⁺ buried layer, and a further P⁺ region. The N⁺ cathode region extends into the N⁻ layer from its upper surface. The P⁺ anode region extends into the N⁻ layer from its upper surface and surrounds the N⁺ cathode region (as viewed from above). The N⁺ buried layer is situated between the N⁻ epitaxial layer and the P⁻ substrate, beneath the P⁺ anode region, and surrounds the N⁺ cathode region. The further P⁺ region extends into the N⁻ epitaxial layer from its upper surface, surrounds the N⁺ cathode region and, in turn, is surrounded by the P⁺ anode region. We provide a bias means for supplying the further P⁺ region with a plurality of different bias drives, one at a time, so as to effect different degrees of conductivity in the N⁻ epitaxial layer, between the N⁺ cathode region and the P⁺ anode region.

In accordance with a further embodiment of our invention, we provide a bipolar transistor which is structurally similar to the foregoing P-N diode, except that an N⁺ emitter region extends into a P region corresponding to the P⁺ anode region of the P-N diode. The bipolar transistor has an N⁺ collector region corresponding to the N⁺ cathode region of the P-N diode.

BRIEF DESCRIPTION OF THE DRAWINGS

While the specification concludes with claims particularly pointing out and distinctly claiming the subject matter which we regard as our invention, it is believed that the invention will be better understood with reference to the following description, taken in conjunction with the drawings, in which:

FIG. 1 is a schematic view in cross-section of a portion of a P-N diode in accordance with our invention FIG. 2 is a view of a modified P-N diode incorporating an alternative bias means in accordance with our invention;

FIG. 3 is a detail view of a portion of the P-N diode of FIG. 1; and

FIG. 4 is a view of a modification of the structure of FIG. 3 for implementing a bipolar transistor.

DESCRIPTION OF THE PREFERRED EMBODIMENTS

FIG. 1 illustrates a portion of a P-N diode 10 to the left of a line of symmetry 12. P-N diode 10 suitably comprises a bulk P⁻ substrate 14, preferably silicon, with an N⁻ layer 16 thereon, preferably an epitaxial silicon layer. An N⁺ cathode region 18 extends into the N⁻ layer 16 from the upper surface thereof. A P⁺ anode region 20 extends into N⁻ layer 16 from its upper surface and surrounds N⁺ region 18 as viewed from above. N⁺ buried layer 22 is situated between N⁻ layer 16 and P⁻ substrate 14, beneath P⁺ anode region 20 and surrounds N⁺ cathode region 18. A further P⁺ region 24 extends into N⁻ layer 16 from its upper surface, surrounds N⁺ cathode region 18, and, in turn, is surrounded by P⁺ anode region 20. A P⁺ isolation region 26 is integrally connected to P⁻ substrate 14, and surrounds the periphery of N⁻ layer 16, thereby enabling other semiconductor devices to be formed, along with P-N diode 10, in an integrated circuit.

The presence of N⁺ buried layer 22 in P-N diode 10 serves to reduce parasitic currents in diode 10 that otherwise would exist. The presence of P⁺ region 24, appropriately biased to a potential approximately equal to or slightly more positive than that of P− substrate 14 when diode 10 is in a current-blocking state, enables the portion of N− epitaxial layer 16 between P+ region 24 and N+ cathode 18 to support high reverse voltages. This is because, without P+ region 24 so biased, N+ buried layer 22 would rise in potential to that of N+ cathode 18, leaving only the thin region of N− layer 16 between N+ buried layer 22 and P+ anode region 20 to support reverse voltages. Such thin region of N− layer 16 would likely break down under high reverse voltage.

In accordance with our invention, we provide a bias means 28 for supplying P+ region 24 with a plurality of different bias drives so as to differently bias P-N junction 32, extant between P+ region 24 and N− layer 16. The different biasing conditions of P-N junction 32 serve to effect different degrees of conductivity in the N− layer 16 between P+ anode region 20 and N+ cathode region 18, as will be described more fully hereinbelow.

Bias means 28, in the exemplary embodiment illustrated, comprises a depletion mode (i.e., normally-conducting) P-channel metal-oxide-semiconductor field effect transistor (MOSFET) 34. MOSFET 34, in the absence of any bias voltage on its gate 36, electrically shorts P+ region 24 to P+ isolation region 26, which is at the potential of P− substrate 14. This is because, in such state of MOSFET 34, P-channel 38 of MOSFET 34 provides a high conductivity path between P+ region 39, which is electrically shorted to P+ region 24, and P+ isolation region 26. When gate 36 is biased with a positive voltage in excess of a threshold value so as to deplete P-channel 38 of holes and thereby reduce its conductivity, P+ region 24 is open circuited, that is, supplied with a bias drive of zero current. This zero current bias drive of P+ region 24 advantageously results in P-N diode 10 having a lower value of on-resistance than if P+ region 24 were biased to the potential of P− substrate 14. This is because, in P-N diode 10, there is a much smaller depletion region extending into N− layer 16 from P-N junction 32, in contrast to the case where P+ region 24 is biased to the P− substrate 14 potential, such as appertains to the P-N diode of the above-referenced application.

Bias means 28 with MOSFET 34 is preferably formed along with P-N diode 10 in a single integrated circuit. However, bias means 28 could be implemented as a separate device. Bias means 28 is an exemplary bias means for P+ region 24, and could be implemented in many different forms. For example, MOSFET 34 of bias means 28 could be replaced by other switching means, such as a bipolar transistor. Moreover, the bias means for P+ region 24 could be implemented as bias means 28', which is illustrated in FIG. 2.

FIG. 2 depicts a P-N diode 40, which is identical to P-N diode 10 (FIG. 1) except for the inclusion of a different bias means 28' for the corresponding P+ region 24', shown to the left of P+ isolation region 26'. The different bias means 28' includes a resistance means 50 of ohmic value R having a terminal 52 adapted to be connected to a source of voltage (not shown) so as to be biased at a positive voltage, $V_s$, and a further terminal 54, which is connected to P+ region 24'. Bias means 28' further includes an enhancement mode or normally-off MOSFET 56. One terminal 58 of MOSFET 56 is electrically shorted, via electrode 60, to P+ isolation region 26', which is at the potential of P− substrate 14. Another terminal 62 of MOSFET 56 is electrically shorted, via conductor 68, to P+ region 24'.

Bias means 28' is effective to produce, via conductor 68, two different bias drives on P+ region 24'. These two different bias drives can be readily understood by considering voltage pulses 70 and 72, which can be determined by monitoring gate 74 of MOSFET 56 and conductor 68, respectively.

With zero bias voltage on gate 74, the voltage on conductor 68 is equal to the bias voltage $V_s$ on terminal 52, reduced by the IR (or current x resistance) voltage drop across resistance means 50. Consequently, P+ region 24' is supplied with a bias drive characterized by the voltage on conductor 68 and by a current limited by the combined resistances of the voltage source (not shown) which biases terminal 52 to $V_s$ volts the resistance means 50, and the resistance through P+ region 24' to a ground or reference level.

With gate 74 of MOSFET 56 biased at a positive voltage, $V_s$, above a threshold value, an inversion layer is formed in region 76 of MOSFET 56, beneath gate 74. The inversion layer is highly conductive to electrons, and, together with N+ regions 78 and 80, completes a current path from terminal 58, which is at the potential of P− substrate 14', to conductor 68, via terminal 62, thereby biasing conductor 68 to the potential of P− substrate 14'. With conductor 68 so biased, P+ region 24' is supplied with a bias drive characterized by the P− substrate 14' potential and by no current (or zero level current), since P-N junction 32', between P+ region 24' and N− layer 16' is reverse biased.

When P-N diode 40 is operating in its current-blocking state, P+ region 24' should be supplied with a bias drive characterized by the potential of P− substrate 14' and zero current. When P-N diode 40 is operating in its current-conducting state, however, P+ region 24' should be supplied with a bias drive characterized by being at the potential $V_s$, as reduced by the IR voltage drop across resistance means 50. With such potential of P+ region 24' being greater than about one volt above the potential of P+ anode region 20', at least for silicon devices, P-N junction 32', between P+ region 24' and N− layer 16', is forward biased, and, in accordance with an important aspect of our invention P+ region 24' thereby injects holes into N− layer 16'. Then, in accordance with the principle of quasi-neutrality (as discussed for example, in R. S. Muller and T. I. Kamins, *Device Electronics for Integrated Circuits*, New York, N.Y.: Wiley & Sons (1977), pages 105, 111 and 112 the concentration of electrons in N− layer 16' increases to approximately that of the holes injected thereinto by P+ region 24'. As a result, the resistance of N− layer 16', between P+ anode region 20' and N+ cathode region 18', is reduced, thereby reducing the on-resistance of P-N diode 40 so as to achieve a main objective of our invention.

While resistance means 50 and MOSFET 56 are illustrated in the preferred embodiment in which they are formed along with P-N diode 40 in a single integrated circuit, such devices could alternatively be formed as separate devices. If devices 50 and 56 are formed in a single integrated circuit as illustrated, it is desirable that P+ isolation region 26' be interposed between P-N diode 40 and such devices. P+ isolation region 26' could be omitted, however, if the distance of separation between P-N diode 40 and such devices is sufficient to prevent adverse electrical interference therebetween, although this would result in more space consumed in the integrated circuit.

Our invention is also useful in semiconductor devices other than P-N diodes, such as bipolar transistors. To make a bipolar transistor requires a variation of the structure associated with P+ anode region 20 (FIG. 1), which is illustrated in the detail view of FIG. 3. Appropriate modified structure is shown in FIG. 4, in which P base region 120 corresponds to P+ anode region 20 of FIG. 3. In FIG. 4, N+ emitter region 190 extends into P base region 120 from the upper surface of region 120, and surrounds an N+ collector region (not illustrated) which corresponds to N+ cathode region 18 of P-N diode 10 (FIG. 1).

In fabricating the devices illustrated herein, each of the regions shown as extending into a device from the upper surface thereof can be formed by either diffusion or ion implantation, and the N+ buried layers can be formed by either diffusion or ion implantation through the upper surface of the respective P− substrate prior to the growth of the respective N− epitaxial layer thereon.

In the best mode we contemplate for practicing our invention, the mathematical product of the thickness and doping concentration of the N− epitaxial layer of each device described herein is selected in accordance with Reduced Surface Field (or RESURF) Technology in order to maximize the reverse voltage attainable by each device. Details of RESURF Technology may be found, for example, in an article by J. A. Appels and H. M. J. Vaes, "High Voltage Thin Layer Devices (RESURF Devices)", Proceedings of the 1979 IEEE International Electron Device Meeting, pages 238–241, as well as in an article by S. Colak, B. Singer and E. Stupp, "Design of High-Density Power Lateral DMOS Transistors", Proceedings of the 1980 IEEE Power Electronics Specialists Conference, pages 164–167.

In summary, the foregoing describes high voltage semiconductor devices having reduced on-resistance. Suitable semiconductor devices employed to attain such reduced on-resistance can advantageously be formed along with such a high voltage semiconductor device in a single integrated circuit.

While only certain preferred features of our invention have been shown by way of illustration, many modifications and substitutions will occur to those skilled in the art, such as those discussed in the above-referenced patent application. It is, therefore, to be understood that the appended claims are intended to cover all such modifications and substitutions as fall within the true spirit of our invention.

What is claimed as our invention and desired to be secured by Letters Patent of the United States is:

1. In combination:
a semiconductor device comprising a body of semiconductor material including:
  a substrate of one conductivity type with a layer of opposite conductivity type thereon, and including first and second regions disposed within said layer; said first region being of said opposite conductivity type and more heavily doped than said layer and extending to an upper surface of said body and said second region being of said one conductivity type, extending to said upper surface, being spaced from and surrounding said first region,
  a third region of said opposite conductivity type buried between said layer and said substrate beneath said second region and spaced from said second region by a portion of said layer,
  a fourth region of said one conductivity type disposed within said layer, forming a P-N junction therewith, extending to said surface, being spaced from and surrounding said first region and, in turn, being surrounded by and spaced from said second region, and
  a controllable bias means integrated therein for controllably connecting said fourth region to said substrate and disconnecting said fourth region from said substrate;
a first electrode in ohmic contract with said first region;
a second electrode in ohmic contact with said second region;
a third electrode connected as an output electrode of said controllable bias means;
a fourth electrode in ohmic contact with said fourth region;
a fifth electrode connected as a control electrode for said controllable bias means;
a sixth electrode in ohmic contact with said substrate;
said third electrode being ohmically connected to said fourth electrode to enable said controllable bias means to control the potential of said fourth region to establish different degrees of conductivity in said layer between said first region and said second region in response to control signals applied to said fifth electrode.

2. The invention of claim 1 wherein said controllable bias means comprises switching means for controllably connecting said third electrode to said substrate.

3. The invention of claim 1 wherein said controllable bias means comprises switching means for controllably providing an open circuit at said third electrode.

4. The invention of claim 1 wherein said controllable bias means comprises switching means for in a first state connecting said third electrode to said substrate, and, in a second state, disconnecting said third electrode from said substrate.

5. The invention of claim 4 wherein said switching means comprises a MOSFET integrated in said body.

6. The invention of claim 1 wherein said controllable bias means comprises switching means for alternately connecting said third electrode to said substrate and disconnecting said third electrode from said substrate.

7. The invention of claim 1 further comprising a voltage lead adapted for connection to a voltage source and wherein said controllable bias means comprises switching means for controllably connecting said third electrode to said voltage lead.

8. The invention of claim 7 further comprising a resistor integrated in said body and connected in the current path between said third electrode and said voltage lead.

9. The invention of claim 8 wherein said resistor comprises a further region of said one conductivity type extending into said layer from said upper surface.

10. The invention of claim 1 wherein said controllable bias means comprises switching means for connecting a voltage to said third electrode to forward bias said P-N junction to such an extent that said fourth region injects current carriers into said layer.

11. The invention of claim 1 further including a voltage lead adapted for connection to a voltage source and wherein said controllable bias means includes switching means or in a first state connecting said third electrode to said voltage lead, and, in a second state, connecting said third electrode to said substrate.

12. The invention of claim 11 further comprising a resistor integrated in said semiconductor body and connected in the current path between said third electrode and said voltage lead.

13. The invention of claim 12 wherein said resistor comprises a further region of said one conductivity type extending into said layer from said upper surface.

14. The invention of claim 13 wherein said switching means comprises a MOSFET integrated in said body.

15. The invention of claim 1 further including a voltage lead adapted for connection to a voltage source and wherein said controllable bias means includes switching means for alternately connecting said third electrode to said voltage lead and to said substrate.

16. The invention of claim 1 further comprising an isolation region integrally connected to said substrate and surrounding the periphery of said layer.

17. The invention of claim 1 further comprising an additional region of said opposite dopant type extending into said second region from the upper surface thereof and surrounding said first region.

18. The invention of claim 1 wherein said substrate and said second and fourth regions comprise semiconductor material of P-type conductivity and said layer and said first and third regions comprise semiconductor material of N-type conductivity.

19. The invention of claim 18 wherein said substrate, said layer, and said first, second, third and fourth regions each comprise silicon semiconductor material.

20. In a semiconductor RESURF device of the type including a substrate of one conductivity type having a thin layer of opposite conductivity type semiconductor material thereon, said layer including first and second regions therein; said first region being of said opposite conductivity type, more heavily doped than said layer and extending into said layer from the upper surface thereof, and said second region being of said one conductivity type, extending into said layer from said upper surface and spaced from and surrounding said first region, a first electrode in ohmic contact with said first region, a second electrode in ohmic contact with said second region, and a third electrode in ohmic contact with said substrate, the improvement comprising:
a third region of said opposite conductivity type buried between said layer and said substrate beneath said second region and in projection on said upper surface encompassing said second region;
a fourth region of said one conductivity type extending into said layer from said upper surface and forming a P-N junction therewith, spaced from and encircling said first region and, in turn, being spaced from and encircled by said second region; and
controllable bias means integrated in said device and ohmically coupled to said fourth region for adjustably biasing and unbiasing said fourth region relative to said substrate to controllably alter the conductivity of said thin layer between said first and second regions.

21. The device of claim 20, wherein said controllable bias means is adapted to supply to said fourth region, a potential about one volt above the potential of the second region, whereby the junction between the fourth region and the thin layer is forward biased and said fourth region injects carriers into said thin layer to thereby reduce the resistance of said thin layer between said first and second regions of the semiconductor RESURF device.

22. The semiconductor device of claim 1 wherein:
said body of semiconductor material further includes:
a fifth region of said one type conductivity disposed in said layer and extending to said upper surface and disposed in ohmic contact with said third electrode, and
an additional region of said one conductivity type integrally connected to said substrate and extending to said upper surface of said body;
said controllable bias means comprises an insulated gate electrode disposed on said layer for controlling the conductivity of a channel connecting said fifth region to said additional region for coupling said third electrode to said substrate in response to the application of an appropriate bias and for decoupling said third electrode from said substrate in response to removal of said bias.

23. The semiconductor device of claim 22 wherein said insulated gate electrode extends over said additional region and in response to said application of said appropriate bias induces a connection between said fifth region and said additional region.

24. The semiconductor device of claim 1 wherein said controllable bias means includes:
a fifth region of said one type conductivity disposed within said layer;
sixth and seventh regions of said opposite type conductivity disposed within said fifth region in spaced apart relation, said sixth region being coupled to said fourth region and said seventh region being coupled to said substrate; and
a gate electrode overlying, and being insulatingly spaced from said fifth, sixth and seventh regions, said gate electrode controlling conduction within said fifth region between said sixth and seventh regions, and in response to a first appropriate applied bias, coupling said fourth region to said substrate and in response to a second appropriate applied bias, decoupling said fourth region from said substrate.

25. The semiconductor device of claim 1 wherein said ohmic connection between said third and fourth electrodes comprises a high conductivity path disposed on said layer.

26. The semiconductor device of claim 1 wherein said ohmic connection between said third and fourth electrodes comprises a metallized track extending from said third electrode to said fourth electrode.

27. A semiconductor device comprising a body of semiconductor material including:
a first layer of one type conductivity;
a second layer of opposite type conductivity disposed on said first layer;
a first region of said opposite type conductivity more heavily doped to said opposite type conductivity than said second layer, disposed within said second layer and extending to an upper surface of said body;
a second region of said one type conductivity disposed within said second layer, extending to said upper surface, spaced from and surrounding said first region;
a third region of said opposite conductivity type buried between said second layer and said first layer beneath said second region, said third region being spaced from said second region by a portion of said second layer and in projection on said upper surface encompassing said second region;
a fourth region of said one conductivity type extending into said second layer from said upper surface and forming a P-N junction therewith, spaced from and encircling said first region and, in turn, being encircled by and spaced from said second region;

a first electrode ohmically connected to said first region;

a second electrode ohmically connected to said second region;

a third electrode ohmically connected to said first layer;

a fourth electrode ohmically connected to said fourth region; and an insulated gate disposed on said second layer for controlling the conductivity of a channel in a current path coupling said fourth electrode to said first layer for coupling said fourth electrode to said first layer in response to an appropriate applied bias and for decoupling said fourth electrode from said first layer in response to removal of said appropriate applied bias.

28. The semiconductor device of claim 27 wherein said insulated gate in response to application of said appropriate bias induces a connection between said fourth electrode and a fourth region of one type conductivity connected to said first layer.

29. The semiconductor device of claim 28 wherein said insulated gate disposed on said second layer comprises an insulation layer disposed on said second layer and a gate electrode disposed atop said insulation layer.

30. The semiconductor device of claim 29 further including a fifth region of said one type conductivity disposed within said second layer, said fourth electrode being directly connected to said fifth region, said gate electrode and said insulation layer further overlying said fifth and further regions.

31. The semiconductor device of claim 29 wherein said further region extends through said second layer and is integrally connected to said first layer and said insulated gate is in part disposed over said further region.

32. A semiconductor device comprising a body of semiconductor material including:

a first layer of one type conductivity;

a second layer of opposite type conductivity disposed on said first layer;

a first region of said opposite type conductivity more heavily doped to said opposite type conductivity than said second layer, disposed within said second layer and extending to an upper surface of said body;

a second region of said one type conductivity disposed within said second layer, extending to said upper surface and spaced from and surrounding said first region;

a third region of said opposite conductivity type buried between said second layer and said first layer beneath said second region, said third region being spaced from said second region by portion of said second layer and in projection on said upper surface encompassing said second region;

a fourth region of said one conductivity type extending into said second layer from said upper surface and forming a P-N junction therewith, spaced from and encircling said first region and, in turn, being encircled by and spaced from said second region;

an additional region of said one conductivity type integrally connected to said first layer and extending to said upper surface;

a fifth region of one type conductivity disposed within said second layer;

sixth and seventh regions of opposite type conductivity disposed within said fifth region, said sixth region being coupled to said fourth region and said seventh region being coupled to said first layer via said additional region; and a gate electrode overlying, and being insulatingly spaced from said fifth, sixth and seventh regions, said gate electrode, in response to an appropriate applied bias, coupling said fourth region to said first layer and in response to removal of said bias, decoupling said fourth region from said first layer.

33. The semiconductor device of claim 27 wherein said additional region comprises an isolation region surrounding the periphery of said second layer.

34. The semiconductor device of claim 27 further including a second additional region of said opposite dopant type extending into said second region from the upper surface thereof and encircling said first region.

35. The semiconductor device for claim 27 wherein said second and fourth regions comprise semiconductor material of P-type conductivity and said second layer and said first and third regions comprise semiconductor material of N-type conductivity.

36. A semiconductor device comprising:

a substrate of one type conductivity;

a layer of opposite type conductivity disposed thereon;

a first region of opposite type conductivity disposed within said layer and more heavily doped to said opposite type conductivity than said layer;

a second region of said one type conductivity disposed within said layer;

a third region of said opposite type conductivity buried between said layer and said substrate beneath said second region and spaced from said second region by said layer;

a fourth region of said one type conductivity disposed within said layer, spaced from and surrounding said first region and being surrounded by and spaced from said second region;

a bias means integrated in said device and coupled to said fourth region by a current path for supplying said fourth region with bias drives to control the degree of conductivity in said layer between said first region and said second region, said bias means comprising a MOSFET integrated with said substrate of the semiconductor device;

a first electrode in ohmic contact with said first region;

a second electrode in ohmic contact with said second region;

a third electrode in ohmic contact with either the source or the drain region of said MOSFET; and a fourth electrode in ohmic contact with said fourth region;

said third and fourth electrodes being ohmically connected by said current path.

* * * * *